(12) United States Patent
Farnworth et al.

(10) Patent No.: US 8,704,380 B2
(45) Date of Patent: Apr. 22, 2014

(54) METHODS FOR WAFER-LEVEL PACKAGING OF MICROFEATURE DEVICES AND MICROFEATURE DEVICES FORMED USING SUCH METHODS

(75) Inventors: Warren M. Farnworth, Nampa, ID (US); Alan G. Wood, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 699 days.

(21) Appl. No.: 12/874,644

(22) Filed: Sep. 2, 2010

(65) Prior Publication Data

US 2010/0327462 A1    Dec. 30, 2010

Related U.S. Application Data

(62) Division of application No. 11/215,780, filed on Aug. 30, 2005, now Pat. No. 7,807,505.

(51) Int. Cl.
| H01L 23/48 | (2006.01) |
| H01L 23/52 | (2006.01) |
| H01L 29/40 | (2006.01) |
| H01L 23/28 | (2006.01) |
| H01L 23/02 | (2006.01) |
| H01L 21/00 | (2006.01) |

(52) U.S. Cl.
USPC .......... 257/777; 257/686; 257/778; 257/787; 257/E25.013; 257/E25.027; 257/E23.129; 257/E21.603; 257/E21.7

(58) Field of Classification Search
None
See application file for complete search history.

(56) References Cited

U.S. PATENT DOCUMENTS

| 5,107,328 A | 4/1992 | Kinsman |
| 5,128,831 A | 7/1992 | Fox, III et al. |
| 5,138,434 A | 8/1992 | Wood et al. |
| 5,252,857 A | 10/1993 | Kane et al. |
| 5,258,236 A | 11/1993 | Arjavalingam et al. |
| 5,434,745 A | 7/1995 | Shokrgozar et al. |
| 5,518,957 A | 5/1996 | Kim |
| 5,593,927 A | 1/1997 | Farnworth et al. |
| 5,677,566 A | 10/1997 | King et al. |
| 5,696,033 A | 12/1997 | Kinsman |
| 5,707,881 A | 1/1998 | Lum |
| 5,739,050 A | 4/1998 | Farnworth |
| 5,739,585 A | 4/1998 | Akram et al. |
| D394,844 S | 6/1998 | Farnworth et al. |
| 5,815,000 A | 9/1998 | Farnworth et al. |
| 402,638 A | 12/1998 | Wood et al. |
| 5,851,845 A | 12/1998 | Wood et al. |
| 5,883,426 A | 3/1999 | Tokuno et al. |

(Continued)

FOREIGN PATENT DOCUMENTS

WO    WO 03/044859 A1 *    5/2003    ............. H01L 25/04

*Primary Examiner* — Hoang-Quan Ho
(74) *Attorney, Agent, or Firm* — Perkins Coie LLP

(57) ABSTRACT

Methods for wafer-level packaging of microfeature devices and microfeature devices formed using such methods are disclosed herein. A method for packaging microfeature devices in accordance with an embodiment of the invention can include releasably attaching a plurality of first known good microelectronic dies to a carrier substrate in a desired arrangement. In several embodiments, for example, the first dies can be releasably attached to an attachment feature on the carrier substrate. The method can also include attaching one or more second known good microelectronic dies to the individual first dies in a stacked configuration to form a plurality of stacked devices. The method further includes at least partially encapsulating the stacked devices and separating the stacked devices from each other.

16 Claims, 9 Drawing Sheets

(56) References Cited

U.S. PATENT DOCUMENTS

| | | | |
|---|---|---|---|
| 5,891,753 | A | 4/1999 | Akram |
| 5,893,726 | A | 4/1999 | Farnworth et al. |
| 5,894,218 | A | 4/1999 | Farnworth et al. |
| 5,898,224 | A | 4/1999 | Akram |
| 5,933,713 | A | 8/1999 | Farnworth |
| 5,938,956 | A | 8/1999 | Hembree et al. |
| 5,946,553 | A | 8/1999 | Wood et al. |
| 5,958,100 | A | 9/1999 | Farnworth et al. |
| 5,986,209 | A | 11/1999 | Tandy |
| 5,989,941 | A | 11/1999 | Wensel |
| 5,990,566 | A | 11/1999 | Farnworth et al. |
| 5,994,784 | A | 11/1999 | Ahmad |
| 6,004,867 | A | 12/1999 | Kim et al. |
| 6,008,070 | A | 12/1999 | Farnworth |
| 6,008,074 | A | 12/1999 | Brand |
| 6,018,249 | A | 1/2000 | Akram et al. |
| 6,020,624 | A | 2/2000 | Wood et al. |
| 6,020,629 | A | 2/2000 | Farnworth et al. |
| 6,025,728 | A | 2/2000 | Hembree et al. |
| 6,028,365 | A | 2/2000 | Akram et al. |
| 6,046,496 | A | 4/2000 | Corisis et al. |
| 6,048,744 | A | 4/2000 | Corisis et al. |
| 6,048,755 | A | 4/2000 | Jiang et al. |
| 6,049,125 | A | 4/2000 | Brooks et al. |
| 6,051,878 | A | 4/2000 | Akram et al. |
| 6,064,194 | A | 5/2000 | Farnworth et al. |
| 6,066,514 | A | 5/2000 | King et al. |
| 6,072,233 | A | 6/2000 | Corisis et al. |
| 6,072,236 | A | 6/2000 | Akram et al. |
| 6,072,323 | A | 6/2000 | Hembree et al. |
| 6,075,288 | A | 6/2000 | Akram |
| 6,081,429 | A | 6/2000 | Barrett |
| 6,089,920 | A | 7/2000 | Farnworth et al. |
| 6,094,058 | A | 7/2000 | Hembree et al. |
| 6,097,087 | A | 8/2000 | Farnworth et al. |
| 6,103,547 | A | 8/2000 | Corisis et al. |
| 6,107,122 | A | 8/2000 | Wood et al. |
| 6,107,680 | A | 8/2000 | Hodges |
| 6,117,382 | A | 9/2000 | Thummel |
| 6,124,634 | A | 9/2000 | Akram et al. |
| 6,150,717 | A | 11/2000 | Wood et al. |
| 6,153,924 | A | 11/2000 | Kinsman |
| 6,159,764 | A | 12/2000 | Kinsman et al. |
| 6,163,956 | A | 12/2000 | Corisis |
| 6,172,419 | B1 | 1/2001 | Kinsman |
| 6,175,149 | B1 | 1/2001 | Akram |
| 6,184,465 | B1 | 2/2001 | Corisis |
| 6,187,615 | B1 | 2/2001 | Kim et al. |
| 6,188,232 | B1 | 2/2001 | Akram et al. |
| 6,198,172 | B1 | 3/2001 | King et al. |
| 6,208,156 | B1 | 3/2001 | Hembree |
| 6,208,519 | B1 | 3/2001 | Jiang et al. |
| 6,210,992 | B1 | 4/2001 | Tandy et al. |
| 6,212,767 | B1 | 4/2001 | Tandy |
| 6,215,175 | B1 | 4/2001 | Kinsman |
| 6,225,689 | B1 | 5/2001 | Moden et al. |
| 6,228,548 | B1 | 5/2001 | King et al. |
| 6,228,687 | B1 | 5/2001 | Akram et al. |
| 6,229,202 | B1 | 5/2001 | Corisis |
| 6,235,552 | B1 | 5/2001 | Kwon et al. |
| 6,235,554 | B1 | 5/2001 | Akram et al. |
| 6,246,108 | B1 | 6/2001 | Corisis et al. |
| 6,247,629 | B1 | 6/2001 | Jacobson et al. |
| 6,252,308 | B1 | 6/2001 | Akram et al. |
| 6,252,772 | B1 | 6/2001 | Allen |
| 6,255,833 | B1 | 7/2001 | Akram et al. |
| 6,258,623 | B1 | 7/2001 | Moden et al. |
| 6,258,624 | B1 | 7/2001 | Corisis |
| 6,259,153 | B1 | 7/2001 | Corisis |
| 6,261,865 | B1 | 7/2001 | Akram |
| 6,277,671 | B1 | 8/2001 | Tripard |
| 6,281,577 | B1 | 8/2001 | Oppermann et al. |
| 6,284,571 | B1 | 9/2001 | Corisis et al. |
| 6,285,204 | B1 | 9/2001 | Farnworth |
| 6,291,894 | B1 | 9/2001 | Farnworth et al. |
| 6,294,839 | B1 | 9/2001 | Mess et al. |
| 6,297,547 | B1 | 10/2001 | Akram |
| 6,303,981 | B1 | 10/2001 | Moden |
| 6,303,985 | B1 | 10/2001 | Larson et al. |
| 6,310,390 | B1 | 10/2001 | Moden |
| 6,314,639 | B1 | 11/2001 | Corisis |
| 6,316,285 | B1 | 11/2001 | Jiang et al. |
| 6,326,242 | B1 | 12/2001 | Brooks et al. |
| 6,326,244 | B1 | 12/2001 | Brooks et al. |
| 6,326,687 | B1 | 12/2001 | Corisis |
| 6,326,697 | B1 | 12/2001 | Farnworth |
| 6,326,698 | B1 | 12/2001 | Akram |
| 6,329,220 | B1 | 12/2001 | Bolken et al. |
| 6,331,221 | B1 | 12/2001 | Cobbley |
| 6,331,453 | B1 | 12/2001 | Bolken et al. |
| 6,332,766 | B1 | 12/2001 | Thummel |
| 6,365,434 | B1 | 4/2002 | Rumsey et al. |
| 6,407,381 | B1 | 6/2002 | Glenn et al. |
| 6,429,528 | B1 | 8/2002 | King et al. |
| 6,432,796 | B1 | 8/2002 | Peterson |
| 6,437,586 | B1 | 8/2002 | Robinson |
| 6,451,709 | B1 | 9/2002 | Hembree |
| 6,503,780 | B1 | 1/2003 | Glenn et al. |
| 6,548,376 | B2 | 4/2003 | Jiang |
| 6,548,757 | B1 | 4/2003 | Russell et al. |
| 6,552,910 | B1 | 4/2003 | Moon et al. |
| 6,555,400 | B2 | 4/2003 | Farnworth et al. |
| 6,558,600 | B1 | 5/2003 | Williams et al. |
| 6,560,117 | B2 | 5/2003 | Moon et al. |
| 6,561,479 | B1 | 5/2003 | Eldridge |
| 6,564,979 | B2 | 5/2003 | Savaria |
| 6,576,494 | B1 | 6/2003 | Farnworth |
| 6,576,495 | B1 | 6/2003 | Jiang et al. |
| 6,576,531 | B2 | 6/2003 | Peng et al. |
| 6,589,820 | B1 | 7/2003 | Bolken |
| 6,607,937 | B1 | 8/2003 | Corisis |
| 6,614,092 | B2 | 9/2003 | Eldridge et al. |
| 6,622,380 | B1 | 9/2003 | Grigg |
| 6,638,595 | B2 | 10/2003 | Rumsey et al. |
| 6,644,949 | B2 | 11/2003 | Rumsey et al. |
| 6,653,173 | B2 | 11/2003 | Bolken |
| 6,670,719 | B2 | 12/2003 | Eldridge et al. |
| 6,672,325 | B2 | 1/2004 | Eldridge |
| 6,673,649 | B1 | 1/2004 | Hiatt et al. |
| 6,888,159 | B2 | 5/2005 | Farnworth et al. |
| 6,908,784 | B1 | 6/2005 | Farnworth et al. |
| 7,235,431 | B2 | 6/2007 | Wood et al. |
| 2001/0015492 | A1 | 8/2001 | Akram et al. |
| 2002/0001670 | A1 | 1/2002 | Pauw et al. |
| 2002/0094602 | A1 | 7/2002 | Her et al. |
| 2002/0100165 | A1 | 8/2002 | Glenn |
| 2002/0130401 | A1 | 9/2002 | Chee et al. |
| 2004/0056344 | A1* | 3/2004 | Ogawa et al. .............. 257/686 |
| 2004/0214373 | A1 | 10/2004 | Jiang et al. |
| 2005/0104171 | A1 | 5/2005 | Benson et al. |
| 2005/0255632 | A1 | 11/2005 | Biar et al. |
| 2005/0270055 | A1 | 12/2005 | Akram et al. |
| 2005/0277279 | A1 | 12/2005 | Luo et al. |
| 2006/0043573 | A1 | 3/2006 | Hedler et al. |
| 2007/0045875 | A1 | 3/2007 | Farnworth et al. |

\* cited by examiner

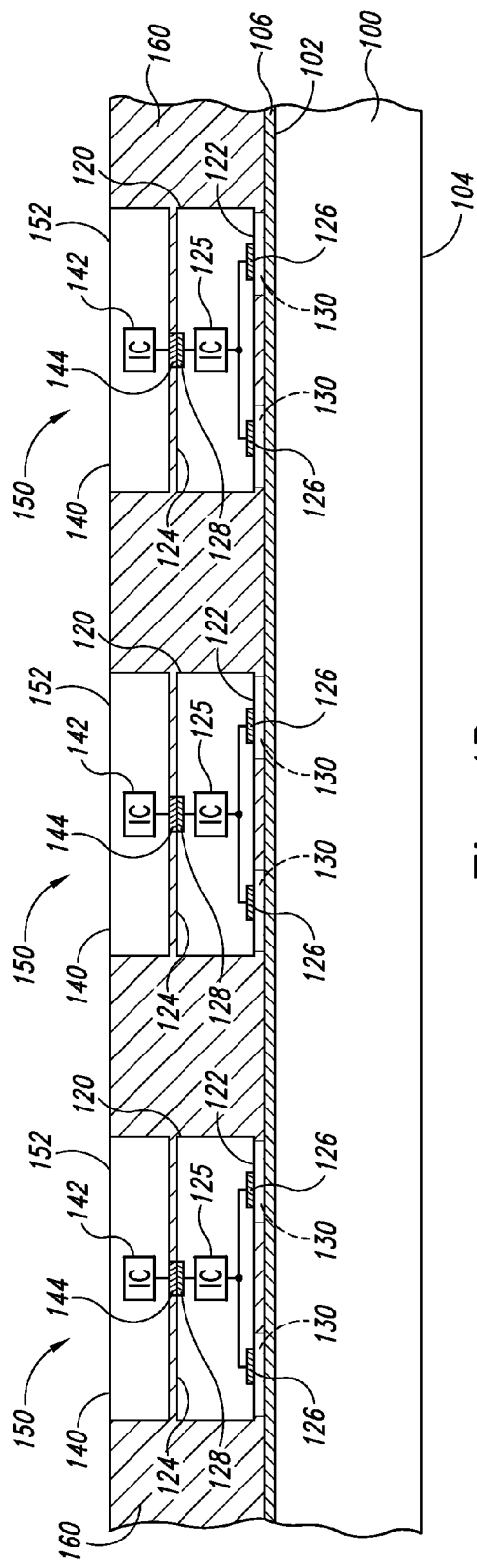
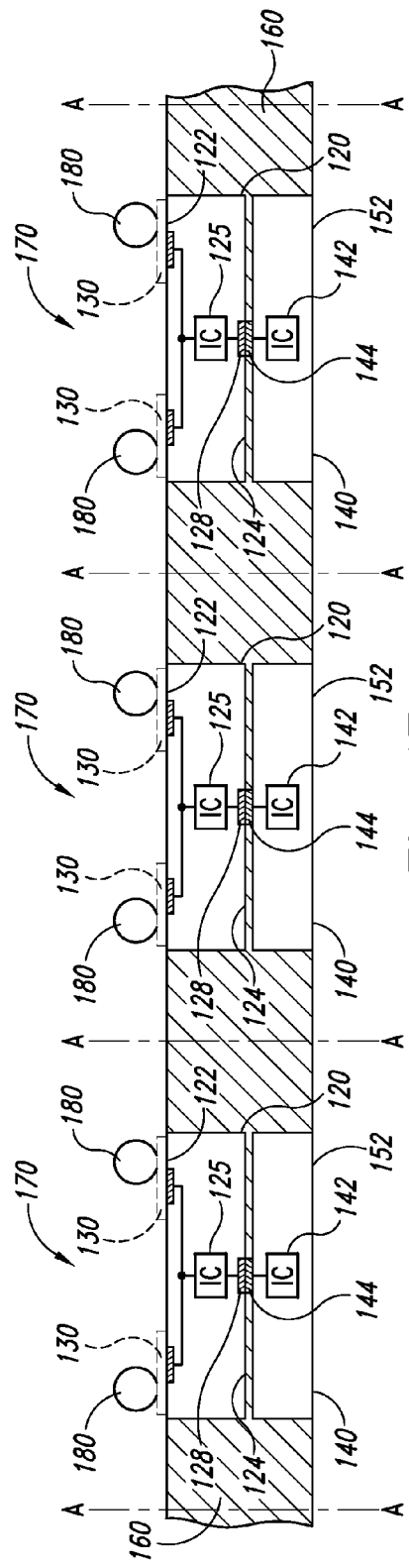
Fig. 1D
Fig. 1E

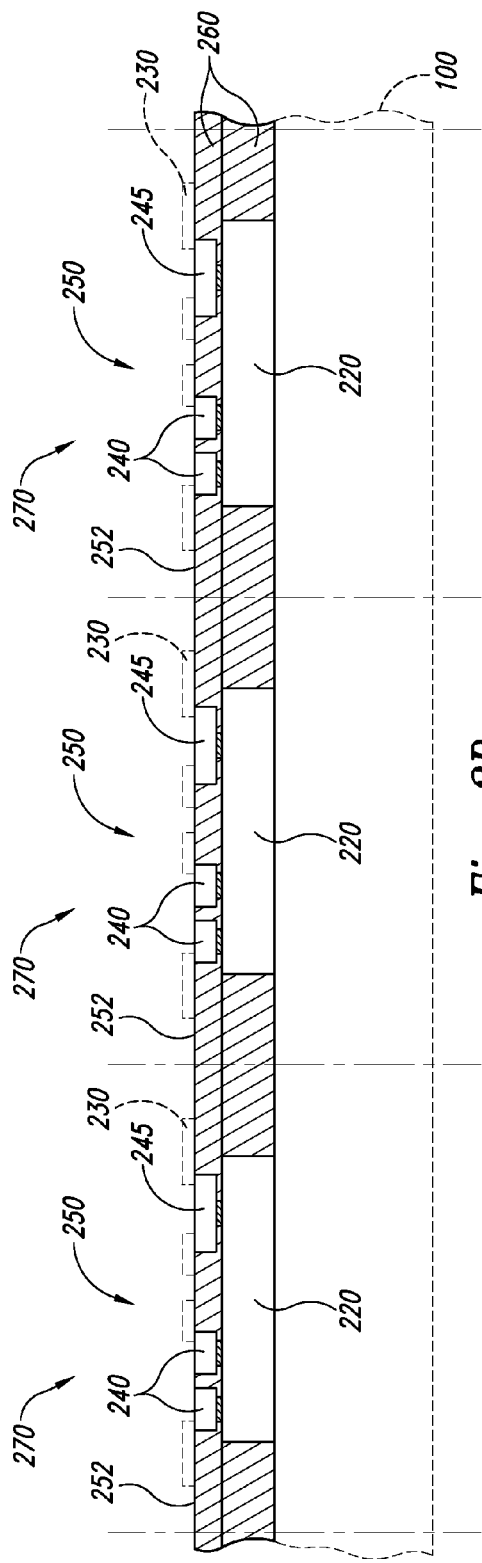
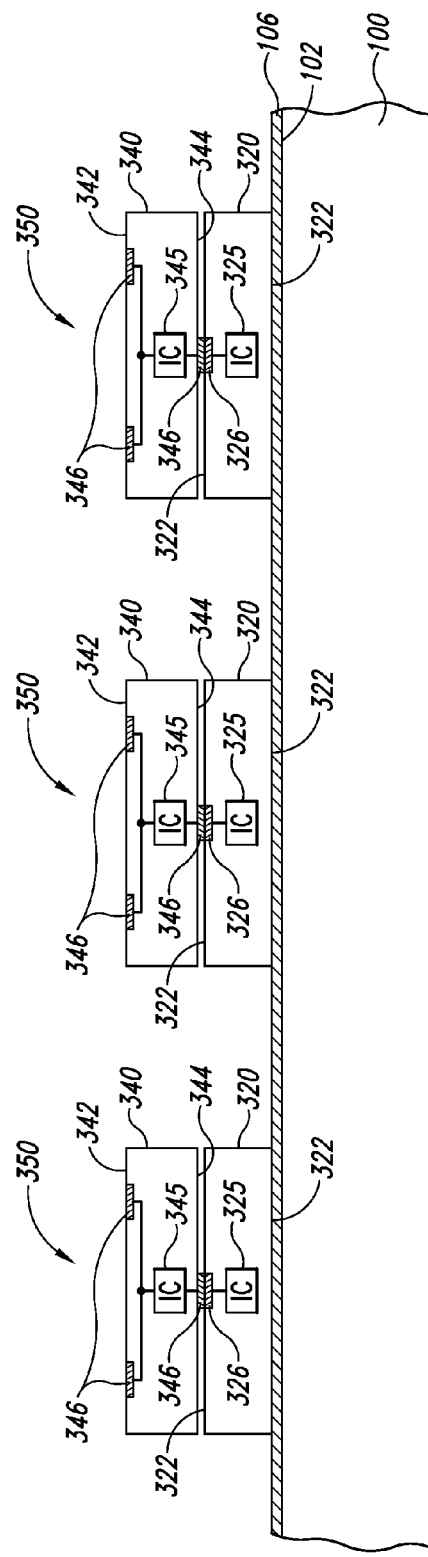
Fig. 2D
Fig. 3A

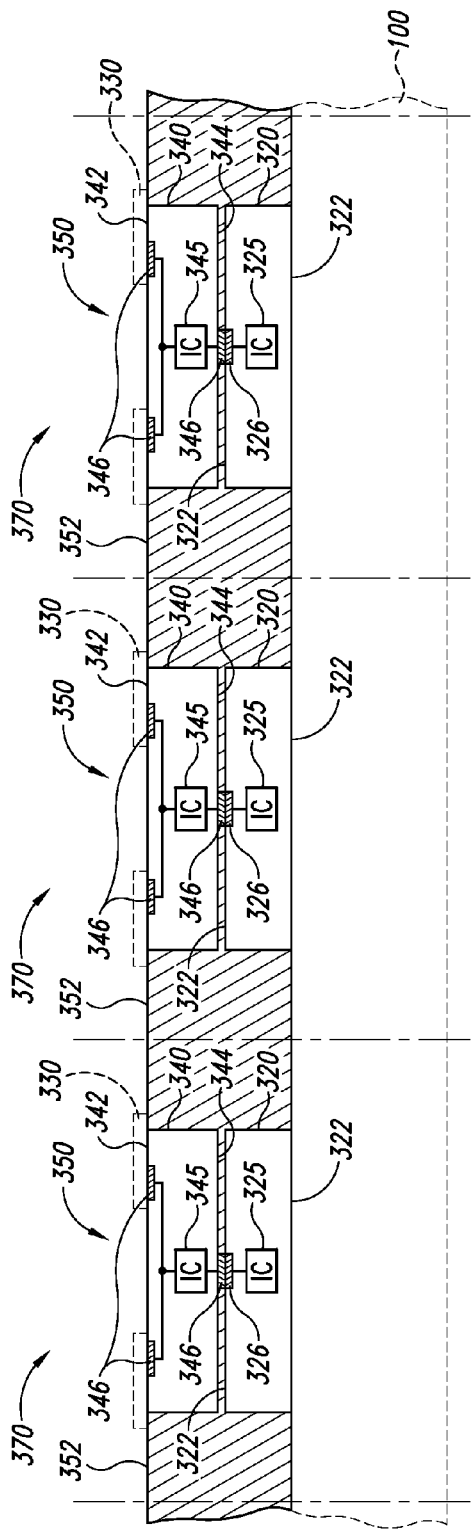
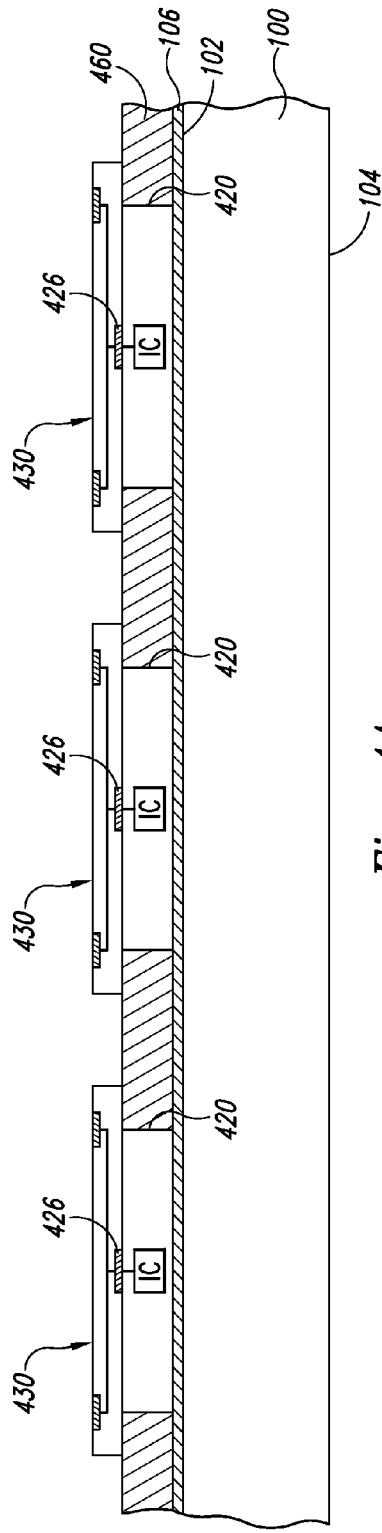

METHODS FOR WAFER-LEVEL PACKAGING OF MICROFEATURE DEVICES AND MICROFEATURE DEVICES FORMED USING SUCH METHODS

CROSS-REFERENCE TO RELATED APPLICATION

This application is a divisional of U.S. application Ser. No. 11/215,780 filed Aug. 30, 2005, now U.S. Pat. No. 7,807,505, which is incorporated herein by reference in its entirety.

TECHNICAL FIELD

The present invention is related to methods for wafer-level packaging of microfeature devices and microfeature devices formed using such methods.

BACKGROUND

Conventional packaged microelectronic devices can include a singulated microelectronic die, an interposer substrate or lead frame attached to the die, and a molded casing around the die. The die generally includes an integrated circuit and a plurality of bond-pads coupled to the integrated circuit. The bond-pads are typically coupled to terminals on the interposer substrate or lead frame, and supply voltage, signals, etc., are transmitted to and from the integrated circuit via the bond-pads. In addition to the terminals, the interposer substrate can also include ball-pads coupled to the terminals by conductive traces supported in a dielectric material. Solder balls can be attached to the ball-pads in one-to-one correspondence to define a "ball-grid array." Packaged microelectronic devices with ball-grid arrays are generally higher grade packages having lower profiles and higher pin counts than conventional packages using lead frames.

Packaged microelectronic devices such as those described above are used in cellular phones, pagers, personal digital assistants, computers, and many other electronic products. To meet the demand for smaller electronic products, there is a continuing drive to increase the performance of packaged microelectronic devices, while at the same time reducing the height and the surface area or "footprint" of such devices on printed circuit boards. Reducing the size of high performance devices, however, is difficult because the sophisticated integrated circuitry requires more bond-pads, which results in larger ball-grid arrays and thus larger footprints. One technique for increasing the component density of microelectronic devices within a given footprint is to stack one device on top of another.

One conventional stacking process includes placing a plurality of singulated first dies in a fixture and stacking a plurality of singulated second dies onto corresponding first dies. The stacked first and second dies can then be heated to reflow solder bumps on the second dies and securely attach the second dies to corresponding first dies. The stacked assemblies of first and second dies are then taken out of the fixture and mounted on an interposer substrate (e.g., in a "flip-chip" arrangement). Another reflow process can be used to securely attach the individual stacked die assemblies to the interposer substrate. The stacked die assemblies on the interposer substrate can then be encapsulated and singulated.

The conventional stacking process described above, however, has several drawbacks. For example, the process includes a large number of steps and accordingly can be relatively expensive. The large number of steps can also reduce the throughput of finished devices. Another drawback of the conventional process described above is that the stacked die assemblies can have a relatively large footprint and occupy a significant amount of vertical space (i.e., high profile) because the dies are stacked on an interposer substrate.

Another conventional stacking process includes forming a plurality of first dies on a first support member (e.g., a film frame) and a plurality of second dies on a second support member (e.g., a film frame). The individual first and second dies can be tested while on the support members with a probe device. After testing, the first and second dies are singulated and mounted directly onto an interposer substrate in a stacked configuration. This stacking process, however, also includes several drawbacks. For example, although the dies are tested before singulation to ensure that they function properly, the dies must still undergo a variety of fabrication and packaging processes (e.g., singulation, bumping, mounting) after testing. If the dies become inoperable and/or damaged after these rigorous packaging processes, the entire packaged device (rather than just the bad die) is generally discarded. Accordingly, there is a need to improve the processes for packaging microfeature devices.

BRIEF DESCRIPTION OF THE DRAWINGS

FIGS. 1A-1F illustrate stages in a method for wafer-level packaging of microfeature devices in accordance with an embodiment of the invention.

FIGS. 2A-2D illustrate stages in a method for wafer-level packaging of microfeature devices in accordance with another embodiment of the invention.

FIGS. 3A and 3B illustrate stages in a method for wafer-level packaging of microfeature devices in accordance with still another embodiment of the invention.

FIGS. 4A and 4B illustrate stages in a method for wafer-level packaging of microfeature devices in accordance with yet another embodiment of the invention.

DETAILED DESCRIPTION

A. Overview/Summary

Figure 1A:
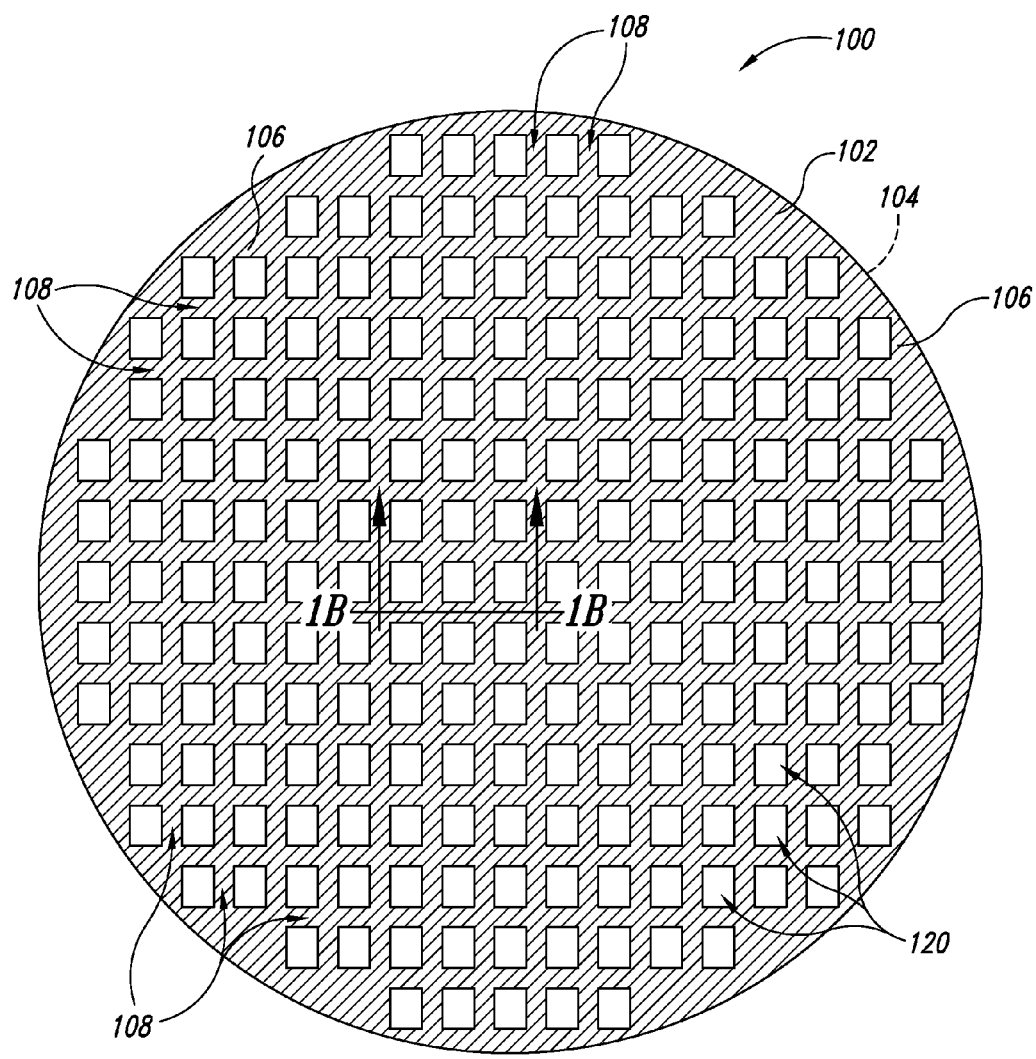

The following disclosure describes methods for wafer-level packaging of microfeature devices and microfeature devices formed using such methods. One aspect of the invention is directed toward a method for packaging microfeature devices. The method can include releasably attaching a plurality of first known good microelectronic dies to a carrier substrate in a desired arrangement. In several embodiments, for example, the first dies can be releasably attached to an attachment feature on the carrier substrate. The method can also include attaching one or more second known good microelectronic dies to the individual first dies in a stacked configuration to form a plurality of stacked devices. The method further includes at least partially encapsulating the stacked devices and separating the stacked devices from each other. In several embodiments, the method can further include (a) removing the carrier substrate after encapsulation and before separating the stacked devices from each other, and (b) attaching a plurality of electrical couplers to external contacts on the first dies after removing the carrier substrate and before separating the stacked devices.

The first and second dies can include a variety of configurations and orientations with respect to each other and/or the carrier substrate. For example, the first dies can include memory devices, processors, or other types of devices that include integrated circuitry. The second dies can include devices generally similar to the first dies, as well as devices including image sensors and optical elements formed on the dies over the image sensors. The first dies can be releasably attached to the carrier substrate with an active side or a back side of the first dies adjacent the carrier substrate, and the second dies can have several different orientations relative to corresponding second dies. In several embodiments, the first dies and/or second dies may also include a redistribution layer.

Another embodiment of a method for packaging microfeature devices includes releasably attaching a plurality of first known good microelectronic dies to a carrier substrate in a desired arrangement such that the carrier substrate is substantially populated with the first dies. The method also includes attaching and electrically coupling second known good microelectronic dies to the individual first dies. The second dies are attached to the first dies in a stacked configuration to form a plurality of stacked units. The method also includes disposing an encapsulant between the stacked units. The carrier substrate is removed from the stacked units after disposing the encapsulant between the stacked units. The method then includes cutting the encapsulant to separate the stacked units from each other.

Still another embodiment of the invention is directed to a method for manufacturing microfeature devices including first known good microelectronic dies and second known good microelectronic dies. The first dies and second dies include integrated circuitry and terminals electrically coupled to the integrated circuitry. The method includes populating a support member with a plurality of first dies such that the support member is substantially populated with the first dies. The method also includes coupling second dies to the individual first dies in a stacked configuration. The method continues by depositing an encapsulant onto the support member to at least partially encapsulate the first dies and the second dies. The method further includes removing the first dies from the support member after at least partially encapsulating the first dies and the second dies and cutting the encapsulant to separate the first dies.

Additional embodiments of the invention are directed toward a microfeature assembly including a carrier substrate and a plurality of first known good microelectronic dies releasably attached to the carrier substrate in a desired arrangement. The assembly can also include a plurality of second known good microelectronic dies attached to corresponding first dies in a stacked configuration. The assembly also includes an encapsulant at least partially encapsulating the first dies and the second dies.

The terms "microfeature assembly" and "microfeature subassembly" are used throughout to include a variety of articles of manufacture, including, e.g., semiconductor wafers having active components, individual integrated circuit dies, packaged dies, and subassemblies comprising two or more microfeature workpieces or components, e.g., a stacked die package. Many specific details of certain embodiments of the invention are set forth in the following description and in FIGS. 1A-5C to provide a thorough understanding of these embodiments. A person skilled in the art, however, will understand that the invention may be practiced without several of these details or additional details can be added to the invention. Well-known structures and functions have not been shown or described in detail to avoid unnecessarily obscuring the description of the embodiments of the invention. Where the context permits, singular or plural terms may also include plural or singular terms, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of features are not precluded.

B. Methods for Wafer-Level Packaging of Microfeature Devices

Figure 1B:
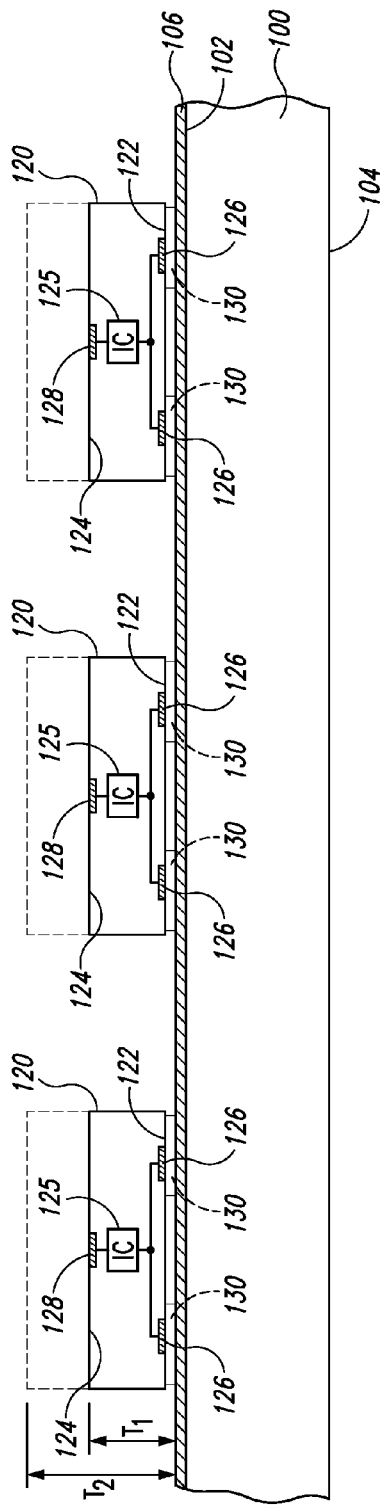
Figure 1C:
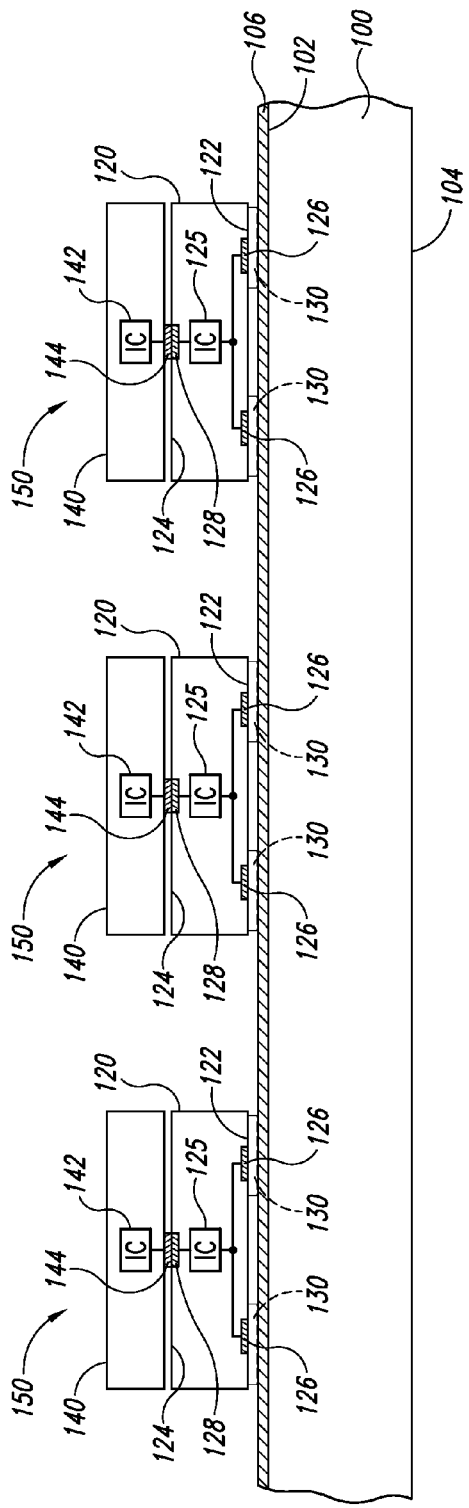

FIGS. 1A-1F illustrate stages in a method for wafer-level packaging of microfeature devices and microfeature devices formed using such a method. FIG. 1A, for example, is a top plan view of a support member 100 (e.g., a carrier substrate) at an initial stage in which the support member 100 is being populated with a plurality of first known good microelectronic dies 120, and FIG. 1B is a side cross-sectional view taken substantially along line 1B-1B of FIG. 1A. Referring to FIGS. 1A and 1B together, the support member 100 includes a first side 102, a second side 104 facing opposite the first side 102, and an attachment feature 106 at the first side 102. The support member 100 can have a form factor (e.g., a shape and thickness) suitable for use in semiconductor processing equipment used for subsequent processing of the first dies 120 and second dies (FIG. 1C). In several embodiments, the support member 100 has a form factor that is the same as the wafers so that wafer processing equipment can be used for further processing.

In several embodiments, the support member 100 can be patterned before being populated with the first dies 120. Patterning, for example, can provide for accurate placement of the first dies 120 on the support member 100 in a predetermined arrangement. The pattern can have generally the same arrangement as a typical wafer array, or in other embodiments the pattern can provide for additional spacing between the first dies 120 attached to the support member 100. In the illustrated embodiment, for example, the first dies 120 are spaced apart from each other by gaps 108 that provide sufficient room for encapsulation of the individual first dies 120 and provide adequate tolerances for further processing (e.g., attaching electrical couplers, forming redistribution layers, constructing optical structures, etc.). These gaps 108 are commonly aligned with one another to facilitate cutting with a wafer saw along lanes similar to streets or scribe lines between the individual first dies 120. In alternative embodiments, the support member 100 may not be patterned before releasably attaching the first dies 120 to the support member 100.

The first dies 120 are releasably attached to the attachment feature 106 on the support member 100 during the repopulation process. The attachment feature 106 can include an adhesive film, epoxy, tape, paste, or other suitable material that releasably secures the first dies 120 in place during processing and has suitable release characteristics for removing the first dies 120 from the support member 100 in subsequent processing steps. Suitable materials for the attachment feature 106 can include REVALPHA thermal release tape, commercially available from Nitto Denko America of Fremont, Calif. In one aspect of this embodiment, the first dies 120 (and the second dies described below with respect to FIG. 1C) can be individually tested and burned-in to ensure that they function properly before being attached to the support member 100 so that only known good dies populate the support member 100.

The individual first dies 120 can include an active side 122, a back side 124, integrated circuitry 125 (shown schematically), a plurality of terminals 126 (e.g., bond-pads) at the active side 122, and a plurality of pads 128 (only one is shown on each die) at the back side 124. In the illustrated embodiment, the individual first dies 120 also include a redistribution layer 130 (shown in broken lines) at the active side 122 and in contact with the attachment feature 106 on the support member 100. In other embodiments, however, the individual first dies 120 may not include a redistribution layer 130. The first dies 120 can include memory devices, processors, or other types of devices that include integrated circuitry. Although the illustrated first dies 120 have the same configuration, in other embodiments the individual first dies 120 may have different features to perform different functions.

In the embodiment shown in FIG. 1B, the first dies 120 have been thinned to a thickness $T_1$ before attachment to the support member 100. In other embodiments, however, the first dies 120 may not be thinned (as shown in broken lines) before being attached to the support member 100. In embodiments where the first dies 120 are not pre-thinned, for example, the first dies 120 can be thinned after attachment to the support member 100 from a thickness $T_2$ to the desired thickness (e.g., thickness $T_1$) using a suitable back grinding process in which the support member 100 is mounted in a grinding machine.

Referring next to FIG. 1C, one or more second known good microelectronic dies 140 are stacked on corresponding first dies 120 to form individual stacked microfeature subassemblies 150 (e.g., stacked devices or stacked units). The individual second dies 140 include integrated circuitry 142 (shown schematically) and a plurality of terminals 144 (only one is shown on each die) electrically coupled to the integrated circuitry 142. The second dies 140 can be attached to corresponding first dies 120 by placing the terminals 144 on the second dies 140 in contact with corresponding pads 128 at the back side 124 of the first dies 120 and using a reflow process to electrically and physically couple the second dies 140 to corresponding first dies 120. As mentioned previously, the second dies 140 can be individually tested and burned-in to ensure that they function properly before being stacked on corresponding first dies 120.

Referring next to FIG. 1D, an encapsulant 160 is deposited onto the support member 100 to at least partially encapsulate the stacked subassemblies 150 on the support member 100. The encapsulant 160 can be deposited onto the support member 100 using a suitable application process, such as a film-assisted molding process or a glob-type dispensing process. In the embodiment illustrated in FIG. 1D, for example, the first dies 120 are already thinned and, accordingly, a film-assisted molding process may be desirable because the encapsulant 160 will not cover a top surface 152 of the subassemblies 150 (i.e., the top surface of the second dies 140). In embodiments where the first dies 120 have not been thinned, the glob-type dispensing process may be desirable because it can be easier to deposit the encapsulant 160 in the gaps 108 (FIG. 1A) between the subassemblies 150 and any residual portions of the encapsulant 160 that remain on the top surface 152 of the subassemblies 150 can be removed during the thinning process. In other embodiments, other methods can be used to encapsulate the subassemblies 150.

Referring next to FIG. 1E, the support member 100 (FIG. 1D) is removed from the encapsulated subassemblies 150 (FIG. 1D) to form a plurality of stacked microfeature devices 170. The microfeature devices 170 can be inverted so that the active sides 122 of the individual first dies 120 project upwardly (as shown in FIG. 1E) and a plurality of electrical couplers 180 (e.g., solder balls) can be attached to corresponding contacts on the first dies 120. After attaching the electrical couplers 180, the assembly can be cut along lines A-A to singulate the microfeature devices 170.

Figure 1F:
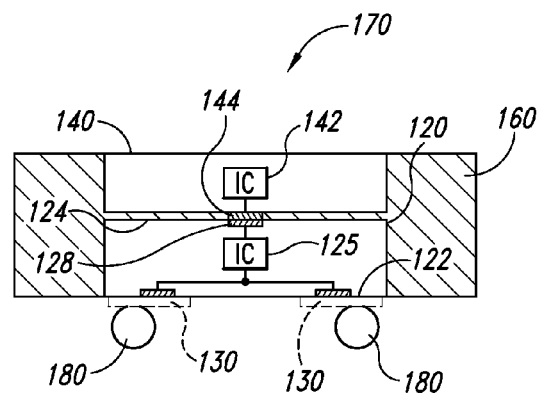

FIG. 1F is a side cross-sectional view of a stacked microfeature device 170 formed using the methods described above. One feature of the microfeature device 170 is that both the first die 120 and the second die 140 can be tested to ensure that they function properly before being assembled together. An advantage of this feature is that each of the microfeature devices 170 formed using the methods described above includes only known good dies. Defective dies can be detected and excluded from the assembly before fully populating the support member 100. Throughput of microfeature devices 170 can accordingly be increased because the microfeature devices 170 will generally include only known good devices. This increases the yield of the wafer-level packaging processes described above and reduces the number of devices that malfunction and/or include defects.

Another feature of the microfeature device 170 is that the first die 120 and the second die 140 are at least partially encapsulated before singulation. An advantage of this feature is that the first and second dies 120 and 140 can be protected from fluids and/or particles while cutting the encapsulant 160 to separate the microfeature devices 170 from each other. The first and second dies 120 and 140 are also protected during subsequent packaging and assembly processes.

One feature of the method described above with respect to FIGS. 1A-1F is that several steps of the process can be completed on multiple first and second dies 120 and 140 while the dies remain releasably attached to the support member 100. An advantage of this feature is that it can be more efficient and therefore cost effective to carry out many of the foregoing packaging processes at the wafer level than at the die level. Another advantage is that the support member 100 can protect the individual dies from breakage and/or damage during handling. Accordingly, by carrying out these processes at the wafer level, the number of steps for packaging the individual microfeature devices 170 can be reduced, which can in turn increase throughput of the devices as well as reducing costs.

C. Additional Embodiments of Methods for Wafer-Level Packaging of Microfeature Devices FIGS. 2A-5C illustrate various stages in methods for wafer-level packaging of microfeature devices in accordance with additional embodiments of the invention. These methods can include several steps generally similar to those described above with respect to FIGS. 1A-1F. Accordingly, like reference numbers are used to refer to like components in FIGS. 1A-1F and FIGS. 2A-5C. The methods described below can also have many of the same advantages described above with respect to FIGS. 1A-1F.

Figure 2A:
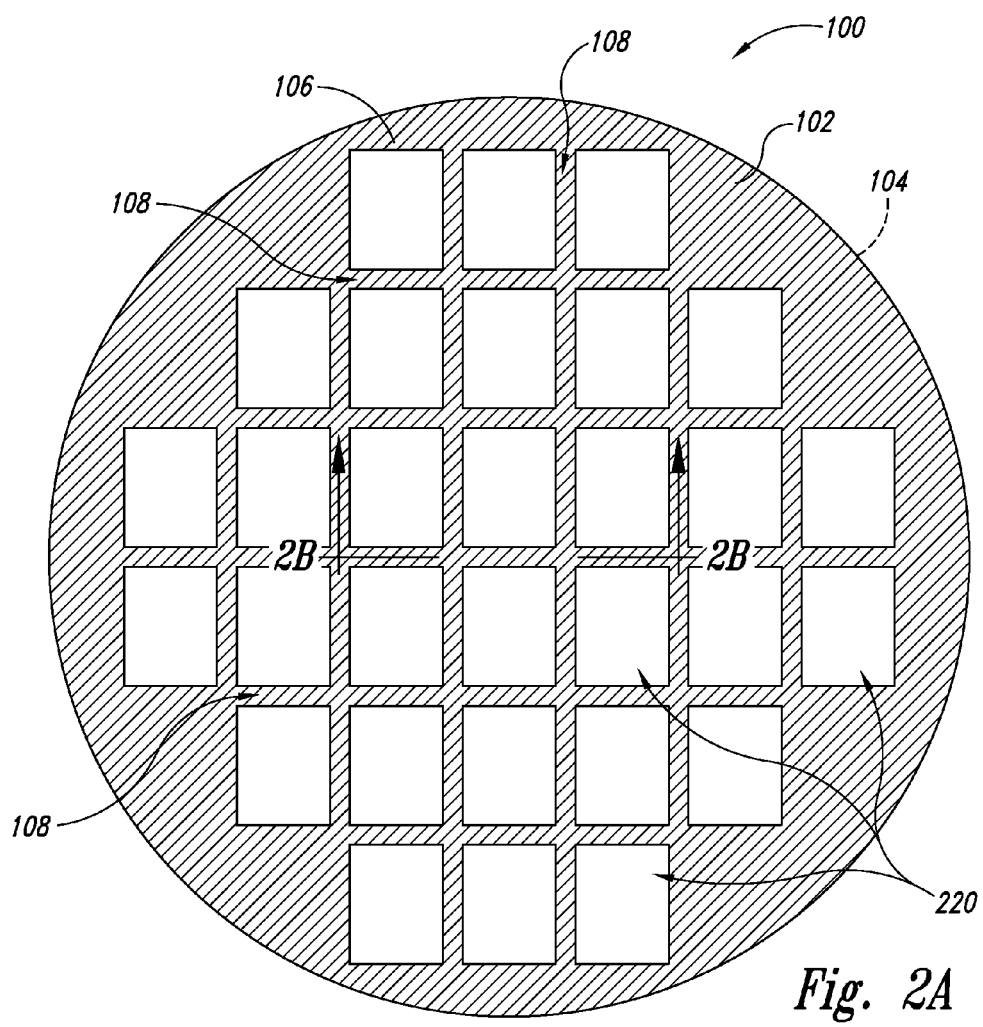
Figure 2B:
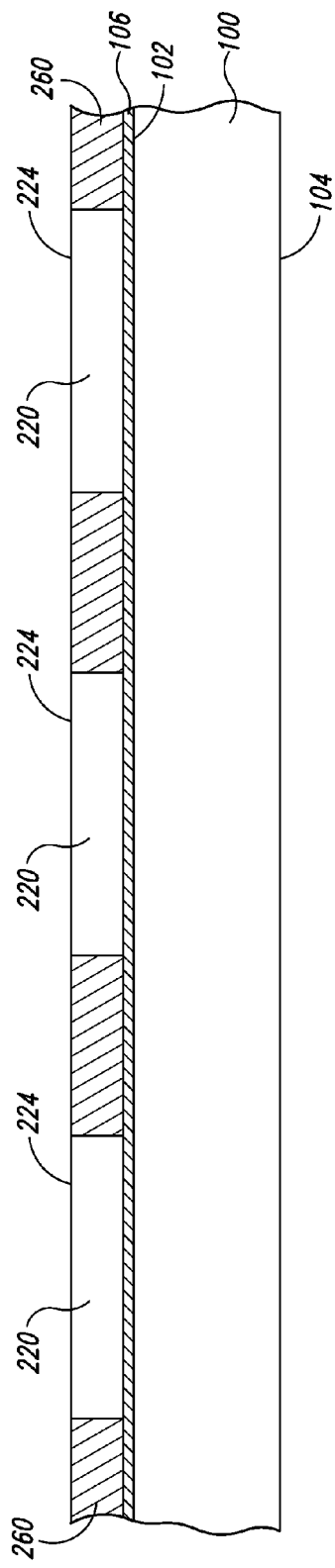

FIG. 2A, for example, is a top plan view of the support member 100 at an initial stage in which the support member 100 is being populated with a plurality of first known good microelectronic dies 220, and FIG. 2B is a side cross-sectional view taken substantially along line 2B-2B of FIG. 2A. Referring to FIGS. 2A and 2B together, the first dies 220 are releasably attached to the attachment feature 106 on the support member 100 during the repopulation process. In one aspect of this embodiment, the first dies 220 are larger (i.e., have a larger footprint and/or vertical profile) than the first dies 120 described above with respect to FIGS. 1A and 1B. The first dies 220 in this embodiment, for example, can include processors or other dies with relatively large footprints.

After the support member 100 is populated with the first dies 220, an encapsulant 260 is deposited onto the support member 100 to encapsulate the first dies 220. The encapsulant 260 can be deposited onto the support member 100 using processes generally similar to those described above with respect to FIG. 1D. In one aspect of this embodiment, the encapsulant 260 is generally deposited only around the peripheries of the first dies 220 and not on a top surface 224 of the first dies 220.

Figure 2C:
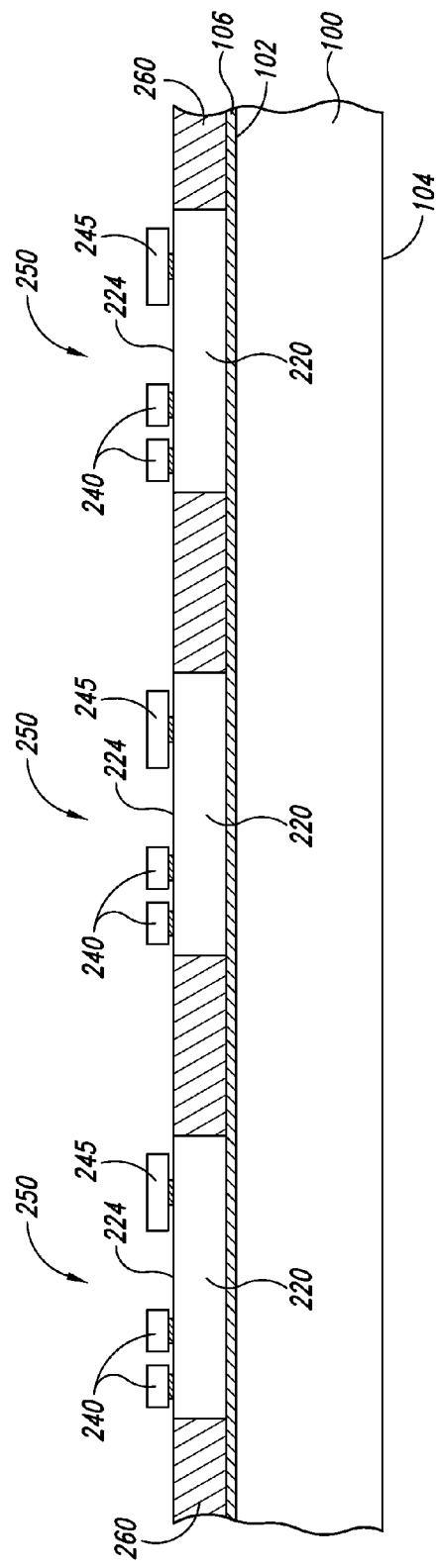

Referring next to FIG. 2C, one or more second known good microelectronic dies 240 (two are shown) and one or more third known good microelectronic dies 245 (only one is shown) are stacked on corresponding first dies 220 to form individual stacked microfeature subassemblies 250. A reflow process can be used to electrically and physically couple the second dies 240 and third dies 245 to corresponding first dies 220. Although only two second dies 240 and one third die 245 are shown on each first die 220, in other embodiments a different number of second dies 240 and/or third dies 245 may be stacked on the first dies 220. In still further embodiments, one or more additional types of dies may be stacked on the first dies 220.

Referring next to FIG. 2D, the stacked subassemblies 250 are at least partially encapsulated using the encapsulant 260 or another suitable encapsulant and the support member 100 (shown in broken lines) is removed from the subassemblies 250. The subassemblies 250 can be encapsulated using the processes described above with respect to FIG. 1D. After encapsulation, the assembly can undergo additional processing as described above with respect to FIGS. 1E and 1F to form a plurality of stacked microfeature devices 270. In several embodiments, a redistribution layer 230 (shown in broken lines) can be formed on and/or in the encapsulant 260 at a top surface 252 of the individual subassemblies 250 before singulation. The redistribution layers 230 can be used to transmit signals from the relatively small arrays of contacts on the second dies 240 and/or third dies 245 to a larger pattern of contacts configured for attachment to other external boards or devices.

FIGS. 3A and 3B illustrate stages in a method for wafer-level packaging of microfeature devices in accordance with still another embodiment of the invention. This method can include several steps that are at least generally similar to those described above with respect to FIGS. 1A-1C. For example, a plurality of first known good microelectronic dies 320 are releasably attached to the support member 100 in a desired arrangement and one or more second known good microelectronic dies 340 are electrically and physically coupled to corresponding first dies 320 using a reflow process to form a plurality of stacked microfeature subassemblies 350. This embodiment differs from the embodiments described above in that the first known good dies 320 have a different configuration and orientation on the support member 100 than the first dies 120 described previously. The first dies 320 in this embodiment, for example, include an active side 322, a back side 324, integrated circuitry 325 (shown schematically), and a plurality of terminals 326 (only one is shown) at the active side 322 and electrically coupled to the integrated circuitry 325. The active sides 322 of the first dies 320 are facing upward in this embodiment, in contrast with the orientation of the first dies 120 described above with respect to FIGS. 1A and 1B where the active sides 122 of the first dies 120 face downward toward the support member 100.

The second dies 340 can also have a different configuration than the second dies 140 described above. The second dies 340, for example, include a first side 342, a second side 344 opposite the first side 342, integrated circuitry 345 (shown schematically), a plurality of terminals 346 at the first side 342, and a plurality of pads 348 (only one is shown) at the second side 344. The pads 348 on the second dies 340 are electrically coupled to corresponding terminals 326 on the first dies 320.

Referring next to FIG. 3B, the subassemblies 350 are at least partially encapsulated using the encapsulant 160 or another suitable encapsulant and the support member 100 (shown in broken lines) is removed from the subassemblies 350. After encapsulation, the assembly can undergo additional processing as described above with respect to FIGS. 1E and 1F to form a plurality of stacked microfeature devices 370. In several embodiments, a redistribution layer 330 (shown in broken lines) can be formed on and/or in the encapsulant 160 at a top surface 352 of the individual subassemblies 350 before singulation.

Figure 4B:
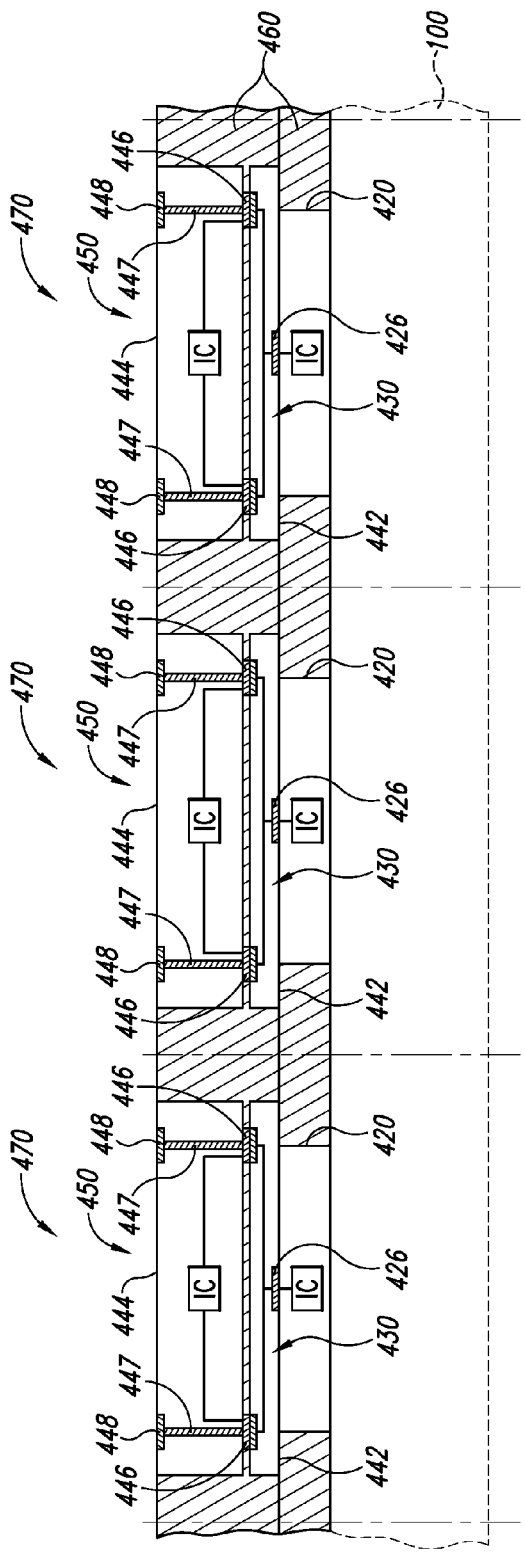

FIGS. 4A and 4B illustrate stages in yet another embodiment of a method for wafer-level packaging of microfeature devices. This method can include several steps that are at least generally similar to those described above. For example, a plurality of first known good microelectronic dies 420 are releasably attached to the support member 100 in a desired arrangement and an encapsulant 460 is deposited around the peripheries of the first dies 420 to at least partially encapsulate the first dies 420. This embodiment differs from those described above in that a redistribution layer 430 is formed on the individual first dies 420 before stacking one or more second known good microelectronic dies 440 (FIG. 4B) on the first dies 420. The redistribution layers 430 can be formed on the first dies 420 at this step because the external contacts on the second dies 440 (FIG. 4B) do not correspond to the arrangement of the array of terminals 426 (only one is shown) on the first dies 420. The redistribution layers 430 can accordingly align the contacts of the first dies 420 with corresponding contacts on the second dies 440 (FIG. 4B).

Referring next to FIG. 4B, one or more second dies 440 have been stacked on corresponding first dies 420 to form stacked microfeature subassemblies 450 and the encapsulant 460 has been deposited onto the support member 100 (shown in broken lines) to at least partially encapsulate the subassemblies 450. After encapsulation, the support member 100 is removed from the subassemblies 450. In one aspect of this embodiment, the second dies 440 include through-wafer interconnects 447 electrically coupling a plurality of contacts 446 at a first side 442 of the second dies 440 to a plurality of terminals 448 at a second side 444 of the second dies 440. After encapsulation, the assembly can undergo additional processing as described above with respect to FIGS. 1E and 1F to form a plurality of microfeature devices 470.

Figure 5A:
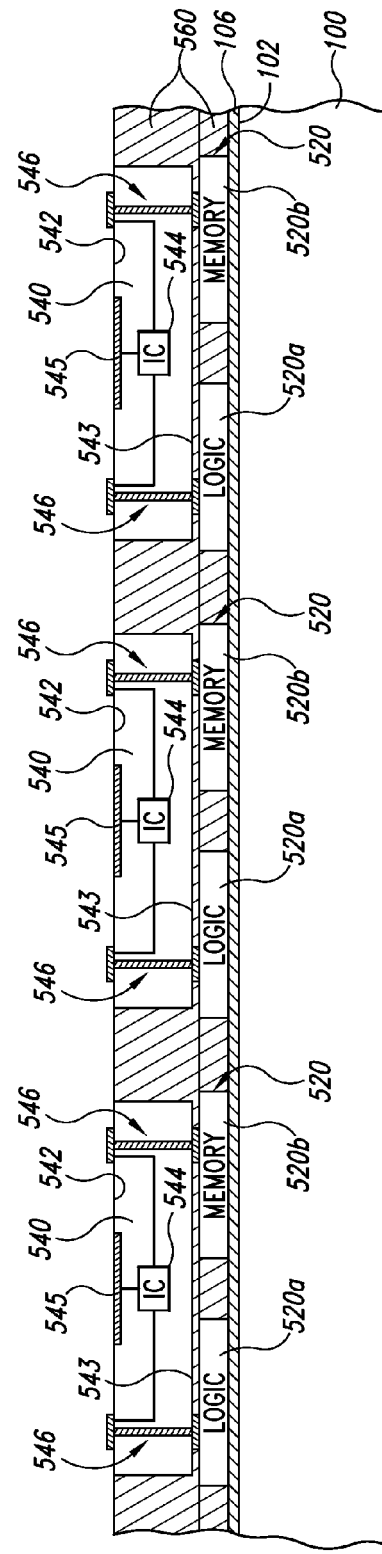
FIGS. 5A-5C illustrate stages in a method for wafer-level packaging of microfeature devices in accordance with another embodiment of the invention.
Figure 5B:
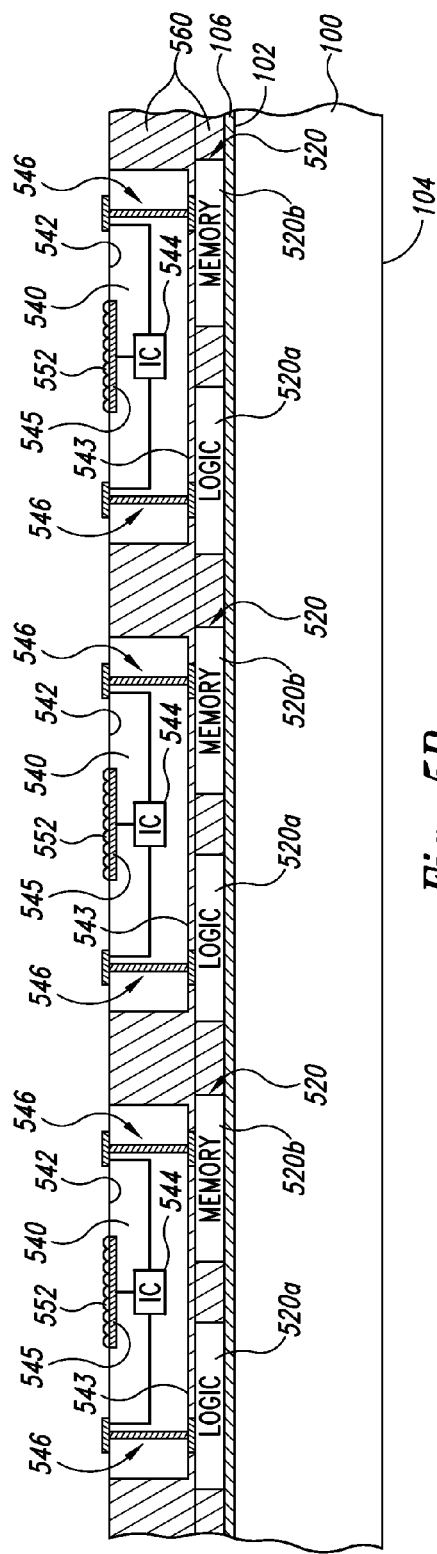
Figure 5C:
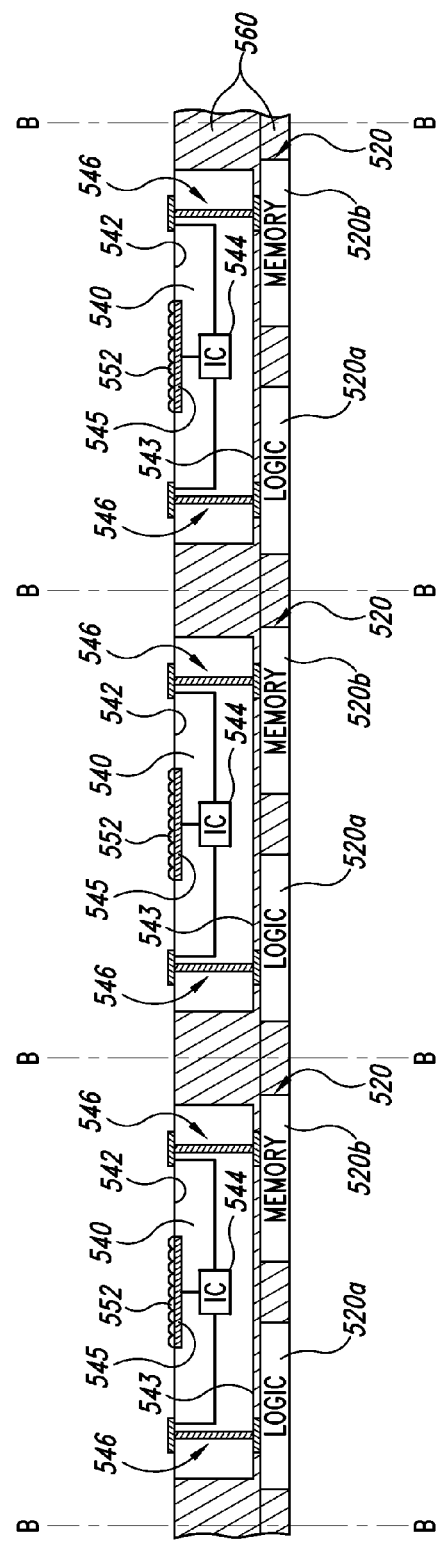

FIGS. 5A-5C illustrate stages in a method for wafer-level packaging of microfeature devices in accordance with another embodiment of the invention. FIG. 5A, for example, is a side cross-sectional view of the support member 100 at an intermediate stage of the method after a plurality of first known good microelectronic dies 520 have been placed on the support member 100 in a desired arrangement. In this embodiment, the first dies 520 can include individual pairs of devices, such as first die 520a with logic-type circuitry and corresponding first die 520b with memory circuitry. In other embodiments, the first dies 520 can include other types of devices and/or have a different configuration. After placing the first dies 520 on the support member 100, an encapsulant 560 can be deposited onto the support member 100 and around the peripheries of the first dies 520 to at least partially encapsulate the first dies 520.

After at least partially encapsulating the first dies 520, a plurality of second known good microelectronic dies 540 can be stacked on corresponding first dies 520 to form a plurality of stacked microfeature subassemblies 550. The individual second dies 540 can include a first side 542, a second side 543 opposite the first side 542, integrated circuitry 544 (shown schematically), an image sensor 545 electrically coupled to the integrated circuitry 544, and external contacts 546 electrically coupled to the integrated circuitry 545. The external contacts 546, for example, can include a plurality of terminals 547 at the first side 542, a plurality of contacts 548 at the second side 543, and interconnects 549 extending through the second dies 540 electrically coupling the terminals 547 to corresponding contacts 548. In the embodiment illustrated in FIG. 5A, the subassemblies 550 have been at least partially encapsulated with the encapsulant 560. The encapsulant 560 can be deposited onto the support member 100 using processes generally similar to those described above with respect to FIG. 1D.

Referring next to FIG. 5B, a plurality of optical elements can be formed over the image sensors 545 on the second dies 540. In the illustrated embodiment, for example, color filter arrays 552 are formed over the individual image sensors 545. The color filter arrays 552 include individual filters configured to allow the wavelengths of selected colors (e.g., red, green, or blue) to pass to each pixel of the image sensors 545 by placing a filter of that color over the corresponding pixels. A plurality of microlenses (not shown) can be formed over the color filter arrays 552 on the image sensors 545 and an oxide coating (not shown) can be deposited over the microlenses to protect the optical elements during further processing of the assembly. In alternative embodiments, the color filter arrays 552 and/or microlenses can be formed over the image sensors 545 before encapsulating the second dies 540. Referring next to FIG. 5C, the support member 100 (FIG. 5B) is removed from the encapsulated subassemblies 550 and the assembly can be cut along lines B-B to singulate the imagers 570.

One feature of this embodiment is that the optical elements are formed over the image sensors 545 before singulation of the imagers 570. An advantage of this feature is that the image sensors 545 are protected before proceeding with singulation and subsequent packaging processes. For example, the color filter arrays 552, microlenses, and oxide coating protect the image sensors 545 from fluids and particles while cutting the encapsulated first and second dies 520 and 540. A single small particle can ruin an image sensor 545 for high-end applications, such as digital cameras and picture cell phones. However, by forming the optical elements at the wafer level before singulating the individual imagers 570, the image sensors 545 on the individual second dies 540 are protected during the singulation process. Further, the image sensors 545 are also protected during subsequent packaging and assembly processes.

From the foregoing, it will be appreciated that specific embodiments of the invention have been described herein for purposes of illustration, but that various modifications may be made without deviating from the invention. For example, one or more additional layers of dies may be stacked on the first and second known good dies in each of the embodiments described above to form stacked devices having three or more stacked dies. Furthermore, the dies described above may have different arrangements and/or include different features. Aspects of the invention described in the context of particular embodiments may be combined or eliminated in other embodiments. For example, any of the dies described above with reference to one embodiment may be used in any of the other above-described embodiments. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited except as by the appended claims.

We claim:

1. A microfeature assembly, comprising:
   a generally rigid, temporary carrier substrate, wherein the temporary carrier substrate has a form factor corresponding to a form factor of a semiconductor wafer;
   a plurality of first known good microelectronic dies releasably attached to the carrier substrate in a desired arrangement, wherein the carrier substrate is patterned with the desired arrangement before the first known good dies are releasably attached;
   a plurality of second known good microelectronic dies attached to corresponding first dies in a stacked configuration; and
   an encapsulant at least partially encapsulating the first dies and second dies.

2. The assembly of claim 1, further comprising a redistribution layer on the individual second dies.

3. he assembly of claim 1, further comprising a redistribution layer on the individual first dies, wherein the second dies are coupled to the redistribution layers on the first dies.

4. The assembly of claim 1 wherein:
   the first dies include an active side adjacent to the carrier substrate, a back side opposite the active side, integrated circuitry, and a plurality of pads at the back side electrically coupled to the integrated circuitry; and
   the second dies include integrated circuitry and a plurality of terminals electrically coupled to the integrated circuitry, and wherein the terminals are electrically coupled to corresponding pads on the first dies.

5. The assembly of claim 1 wherein:
   the first dies include an active side adjacent to the carrier substrate, a back side opposite the active side, integrated circuitry, a redistribution layer at the active side, and a plurality of pads at the back side electrically coupled to the integrated circuitry; and
   the second dies include integrated circuitry and a plurality of terminals electrically coupled to the integrated circuitry, and wherein the terminals are electrically coupled to corresponding pads on the first dies.

6. The assembly of claim 1 wherein:
   the first dies include an active side, a back side adjacent to the carrier substrate, integrated circuitry, and a plurality of terminals at the active side electrically coupled to the integrated circuitry; and
   the second dies include integrated circuitry and a plurality of pads electrically coupled to the integrated circuitry, and wherein the pads are electrically coupled to corresponding terminals on the first dies.

7. The assembly of claim 1 wherein:
   the first dies include an active side, a back side adjacent to the carrier substrate, integrated circuitry, and a plurality of terminals at the active side electrically coupled to the integrated circuitry, the terminals being arranged on the first dies in a first pattern;
   the second dies include integrated circuitry and an array of external contacts electrically coupled to the integrated circuitry, the external contacts being arranged on the second dies in a second pattern different than the first pattern; and
   the assembly further comprises a redistribution layer on the individual first dies, the redistribution layers including a plurality of pads arranged in the second pattern.

8. The assembly of claim 1 wherein:
   the first dies have a first footprint;

the second dies have a second footprint smaller than the first footprint; and the assembly further comprises a plurality of third known good microelectronic dies stacked on the individual first dies, the third dies having a third footprint smaller than the first footprint.

9. The assembly of claim 1 wherein:

the first dies include corresponding pairs of devices releasably attached to the carrier substrate, the individual pairs including devices with logic-type circuitry and devices with memory circuitry;

the second dies include integrated circuitry and an image sensor electrically coupled to the integrated circuitry; and the assembly further comprises optical elements over the individual image sensors.

10. The assembly of claim 1 wherein the carrier substrate includes an attachment feature, and wherein the first dies are releasably attached to the attachment feature.

11. A microfeature assembly, comprising:

a temporary support member;

a plurality of first known good microelectronic dies populating the support member in a desired arrangement, wherein the first dies are releasably attached to the support member, and wherein the support member is patterned with the desired arrangement before the first dies are releasably attached to the support member, wherein the first dies include an active side adjacent to the support member, a back side opposite the active side, integrated circuitry, and a plurality of pads at the back side electrically coupled to the integrated circuitry;

a plurality of second known good microelectronic dies electrically and physically coupled to corresponding first dies in a stacked configuration, wherein the second dies include integrated circuitry and a plurality of terminals electrically coupled to the integrated circuitry, and wherein the terminals are electrically coupled to corresponding pads on the first dies; and an encapsulant at least partially encapsulating the first dies and second dies.

12. The assembly of claim 11, further comprising a redistribution layer on the individual second dies.

13. The assembly of claim 11, further comprising a redistribution layer on the individual first dies, wherein the second dies are coupled to the redistribution layers on the first dies.

14. The assembly of claim 11 wherein the temporary support member includes an attachment feature, and wherein the first dies are releasably attached to the attachment feature.

15. The assembly of claim 11 wherein:

the first dies have a first footprint;

the second dies have a second footprint smaller than the first footprint; and the assembly further comprises a plurality of third known good microelectronic dies stacked on the individual first dies, the third dies having a third footprint smaller than the first footprint.

16. A microfeature assembly, comprising:

a temporary support member;

a plurality of first known good microelectronic dies populating the support member in a desired arrangement, wherein the first dies are releasably attached to the support member, and wherein the support member is patterned with the desired arrangement before the first dies are releasably attached to the support member, wherein the first dies include corresponding pairs of devices releasably attached to the support member, the individual pairs including devices with logic-type circuitry and devices with memory circuitry;

a plurality of second known good microelectronic dies electrically and physically coupled to corresponding first dies in a stacked configuration, wherein the second dies include integrated circuitry and an image sensor electrically coupled to the integrated circuitry;

optical elements over the individual image sensors; and an encapsulant at least partially encapsulating the first dies and second dies.

* * * * *

UNITED STATES PATENT AND TRADEMARK OFFICE
CERTIFICATE OF CORRECTION

PATENT NO.      : 8,704,380 B2
APPLICATION NO. : 12/874644
DATED           : April 22, 2014
INVENTOR(S)     : Warren M. Farnworth et al.

Page 1 of 1

It is certified that error appears in the above-identified patent and that said Letters Patent is hereby corrected as shown below:

In the Claims:

In column 10, line 21, in Claim 3, delete "he" and insert -- The --, therefor.

Signed and Sealed this
Twenty-second Day of July, 2014

Michelle K. Lee
*Deputy Director of the United States Patent and Trademark Office*